United States Patent
Hügler (10) Patent No.: US 7,845,892 B2
(45) Date of Patent: Dec. 7, 2010

(54) MOVABLE TRANSFER CHAMBER AND SUBSTRATE-TREATING APPARATUS INCLUDING THE SAME

(75) Inventor: Klaus Hügler, Kirchbergstr (DE)

(73) Assignee: Jusung Engineering Co, Ltd., Gwangju-si (KR)

( * ) Notice: Subject to any disclaimer, the term of this patent is extended or adjusted under 35 U.S.C. 154(b) by 717 days.

(21) Appl. No.: 11/465,437

(22) Filed: Aug. 17, 2006

(65) Prior Publication Data
US 2007/0059129 A1    Mar. 15, 2007

(30) Foreign Application Priority Data
Aug. 18, 2005    (DE)    ........................ 10 2005 039 453
Jun. 12, 2006    (KR)    ...................... 10-2006-0052510

(51) Int. Cl.
*B65G 49/07*    (2006.01)
(52) U.S. Cl. ........................ 414/217; 414/939
(58) Field of Classification Search ................. 414/217, 414/939
See application file for complete search history.

(56) References Cited

U.S. PATENT DOCUMENTS

| | | | | |
|---|---|---|---|---|
| 3,584,847 A | * | 6/1971 | Hammond et al. | ............. 432/86 |
| 3,756,435 A | * | 9/1973 | Steigerwald | ................ 414/217 |
| 4,923,352 A | * | 5/1990 | Tamura et al. | .......... 414/225.01 |
| 5,364,219 A | * | 11/1994 | Takahashi et al. | ............ 414/217 |
| 5,417,537 A | * | 5/1995 | Miller | .......................... 414/217 |
| 5,431,600 A | * | 7/1995 | Murata et al. | ................ 454/187 |
| 5,607,276 A | | 3/1997 | Muka et al. | |
| 5,980,183 A | * | 11/1999 | Fosnight | ................ 414/222.01 |
| 6,238,283 B1 | * | 5/2001 | Matsuyama et al. | .......... 454/187 |
| 6,364,593 B1 | * | 4/2002 | Hofmeister et al. | ....... 414/217.1 |
| 6,679,672 B1 | * | 1/2004 | Barrows | ...................... 414/217 |
| 6,863,485 B2 | * | 3/2005 | Mizokawa et al. | ........... 414/217 |
| 7,771,150 B2 | * | 8/2010 | Hugler | ......................... 414/217 |
| 2001/0024611 A1 | | 9/2001 | Woodruff et al. | |
| 2002/0024611 A1 | | 2/2002 | Watanabe et al. | |
| 2006/0099054 A1 | * | 5/2006 | Friedman et al. | ............. 414/217 |
| 2006/0188358 A1 | * | 8/2006 | Bonora et al. | ................ 414/217 |

FOREIGN PATENT DOCUMENTS

| | | | | |
|---|---|---|---|---|
| JP | 6-97258 A | * | 4/1994 | .................. 414/939 |
| WO | WO 00/02808 | | 1/2000 | |
| WO | WO 2004069698 | | 8/2004 | |

* cited by examiner

*Primary Examiner*—James Keenan
(74) *Attorney, Agent, or Firm*—Portland IP Law LLC (57) ABSTRACT

A substrate-treating apparatus including: a plurality of modules disposed along a first direction, each of the plurality of modules having an inner space for containing a substrate; and a transfer unit transferring the substrate among the plurality of modules, the transfer unit including at least one track disposed along the first direction and at least one movable transfer chamber moving along the at least one track, wherein the at least one movable transfer chamber is atmospherically isolated from an exterior while moving.

20 Claims, 8 Drawing Sheets

MOVABLE TRANSFER CHAMBER AND SUBSTRATE-TREATING APPARATUS INCLUDING THE SAME

The present invention claims the benefit of German Patent Application No. 10 2005 039 453.1 filed in Germany on Aug. 18, 2005 and Korean Patent Application No. 10-2006-0052510 filed in Korea on Jun. 12, 2006, which are hereby incorporated by references.

BACKGROUND OF THE INVENTION

1. Field of the Invention

The present invention relates to a movable transfer chamber, and more particularly, to a movable transfer chamber for a large-sized substrate and a substrate-treating apparatus including the movable transfer chamber.

2. Discussion of the Related Art

Apparatuses for a semiconductor device have been widely developed. In US patent application of publication No. US 2002/0024611, for example, a fabrication apparatus for a wafer having a diameter of 300 mm is disclosed. In the fabrication apparatus for a semiconductor device, a track for a transfer device is disposed in a central portion of a case, and a plurality of process stations are disposed along both sides of the track. The transfer device is supported by and moves along the track. In addition, a height of the transfer device is controllable, and the transfer device includes a substrate transfer means having a substrate holder. The substrate holder may be protruded to cross the track and use an arm assembly. The substrate transfer means is connected to the plurality of process stations having the wafer therein through the substrate holder.

The wafer is supplied to the transfer device from a transport box at front of the arm assembly. The fabrication apparatus is surrounded by a case, and the transport box is connected to the case. The transfer device is disposed among the plurality of process stations. Since a space surrounded by the case is isolated from the ambient air, the wafer transferred between the transfer device and the plurality of process stations is prevented from contamination.

However, a high vacuum for improving the isolation and contamination-preventing capacity of the case is limited by economical and structural conditions. The case has a structure whose an inner gas is slowly evacuated due to the pressure difference between the high vacuum space and the ambient air.

In addition, a possibility of transferring the substrate from the transport box to the space without contamination and a possibility of keeping a cleanness in the space while transferring the substrate through the transfer device are also limited. Specifically, the fabrication apparatus can not be applied to a large-sized substrate for a flat panel display (FPD). Since the large-sized substrate may have an area of a several square meters, the fabrication apparatus has an uncontrollable size. The fabrication apparatus for the large-sized substrate may have limitations in time and cost because it takes much time to obtain the high vacuum space for the large-sized substrate. Accordingly, the process time is lengthened and the fabrication cost increases.

SUMMARY OF THE INVENTION

Accordingly, the present invention is directed to a movable transfer chamber and an apparatus including the movable transfer chamber that substantially obviates one or more of the problems due to limitations and disadvantages of the related art.

An object of the present invention is to provide a movable transfer chamber that contains a large-sized substrate under a high vacuum condition and a substrate-treating apparatus including the movable transfer chamber.

Another object of the present invention is to provide a movable transfer chamber that has a simplified structure and a substrate-treating apparatus including the movable transfer chamber where a transfer time of a substrate is minimized.

Another object of the present invention is to provide a movable transfer chamber and a substrate-treating apparatus where a prompt docking between modules and a prompt transfer of a substrate between modules are obtained due to a gate valve.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a substrate-treating apparatus including: a plurality of modules disposed along a first direction, each of the plurality of modules having an inner space containable a substrate; and a transfer unit transferring the substrate among the plurality of modules, the transfer unit including at least one track disposed along the first direction and at least one movable transfer chamber moving along the at least one track, wherein the at least one movable transfer chamber is atmospherically isolated from an exterior while moving.

In the substrate-treating apparatus, each of the plurality of modules includes a transfer hole, and the at least one movable transfer chamber includes an open portion corresponding to the transfer hole. In addition, the at least one movable transfer chamber is approachable to one of the plurality of modules so that the open portion contacts the transfer hole. Each of the open portion and the transfer hole has a size such that the substrate passes through.

In the substrate-treating apparatus, the at least one movable transfer chamber includes first and second movable transfer chambers, and the at least one tracks includes first and second tracks. In addition, the first and second movable transfer chambers independently move along the first and second tracks, respectively. Further, the first and second movable transfer chambers are disposed to have different heights, and the first and second tracks are spaced apart from each other along a second direction crossing the first direction, where the second direction is a horizontal direction, and the first and second tracks are parallel to each other. Moreover, a central portion of the first movable transfer chamber is supported by the first track, and an edge portion of the second movable transfer chamber is supported by the second track. The first movable transfer chamber is supported by and moves along the first track through a first guide slide, and the second movable transfer chamber is supported by and moves along the second track through a second guide slide. The edge portion of the second movable transfer chamber is connected to the second guide slide through a sub-carrier such that the second movable transfer chamber is protruded from the second guide slide to the plurality of modules, where the sub-carrier has a U shape such that an opening of the U shape faces the plurality of modules.

In the substrate-treating apparatus, heights of the first and second movable transfer chambers with respect to the first and second tracks are adjustable by the first and second guide slides, respectively. In addition, the second direction is a vertical direction, and the first and second tracks are disposed to have different heights and parallel to each other. Further, the first and second tracks overlap each other in a plane view. Each of the first and second movable transfer chambers are supported at both end portions, and the first and second movable transfer chambers are disposed over the first and second tracks, respectively.

In the substrate-treating apparatus, the first and second movable transfer chambers may be disposed under the first and second tracks, respectively. In addition, the first movable transfer chamber may be disposed over the first track, and the second movable transfer chamber is disposed under the second track. Further, air downwardly flows outside the first and second movable transfer chambers.

In the substrate-treating apparatus, first and second air circulation spaces surround the first and second movable transfer chambers, and are atmospherically isolated to prevent circulation of contamination materials. In addition, first and second air circulation spaces are atmospherically isolated by a sub-carrier supporting one of the first and second movable transfer chambers and disposed between the first and second movable transfer chambers.

The substrate-treating apparatus further comprises a supporting pillar supporting both end portions of the first and second tracks. Each of the first and second tracks includes a guide rail disposed along the first direction, and the first and second tracks are supported by the supporting pillar through first and second gates, respectively, crossing the guide rail. In addition, each of the first and second gates has a cavity therein, and each of the first and second gates is connected to an external air supply source, and an air is supplied through each of the first and second gates.

The substrate-treating apparatus further comprises a supporting pipe having an air path therein and connected to one of the first and second gates and a center floor connected to the supporting pipe, wherein a first air circulation space surrounding the firs movable transfer chamber is atmospherically isolated from a second air circulation space surrounding the second movable transfer chamber by the center floor.

In the substrate-treating apparatus, the plurality of modules are arranged along first and second module lines as two lines, and the first and second tracks are disposed between the first and second module lines. In addition, the first and second movable transfer chambers includes first and second open portions, respectively, and the first and second open portions face the first and second module lines, respectively.

The substrate-treating apparatus further comprises first and second guide carts supporting the first and second movable transfer chambers, respectively, wherein the first guide cart moves the first movable transfer chamber along the first track and the second guide cart moves the second movable transfer chamber along the second track. In addition, the first guide cart is disposed at front and rear portions of the first movable transfer chamber along the first track, and the second guide cart is disposed at front and rear portions of the second movable transfer chamber along the second track. Further, the first and second guide carts moves along the first and second tracks, respectively, by a linear driving means. Moreover, each of the first and second movable transfer chambers is approachable to one of the plurality of modules with respect to the first and second guide carts.

In the substrate-treating apparatus, the plurality of modules include a plurality of transfer holes, and at least two transfer holes have different heights. In addition, at least two modules having at least two transfer holes of the same heights are arranged ad adjacently, and the plurality of modules are arranged according to a process time in each of the plurality of modules. Further, at least one of the plurality of modules is a transfer module transferring and distributing the substrate, and the other of the plurality of modules is a process module treating the substrate, wherein the transfer module includes first and second transfer holes having different heights. Moreover, the process module is arranged nearer to the transfer module as a process time for treating the substrate in the process module is longer. The transfer chamber is arranged at an outermost position of the plurality of modules.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

A substrate-treating apparatus according to the present invention includes a movable transfer chamber and a plurality of modules. The substrate-treating apparatus does not include a case surrounding the movable transfer chamber and the plurality of modules. The movable transfer chamber is promptly connected to the plurality of modules, and a substrate is promptly transferred among the plurality of modules through the movable transfer chamber. The inner spaces of the movable transfer chamber and the plurality of modules are kept in a vacuum condition, and a size of the movable transfer chamber is minimized to correspond to a size of the substrate.

For example, when a substrate is supported and is transferred by a substrate holder having a rolling metal band and moving up and down without a complicate adjuster, a volume and a weight of the movable transfer chamber may be minimized. The movable transfer chamber may have a flat structure and be protruded from a track.

The substrate-treating apparatus may include a plurality of movable transfer chambers respectively moving along a plurality of tracks. The plurality of tracks may be disposed parallel to each other or to overlap each other. Each movable transfer chamber may be connected to one of the plurality of modules through a connection means, and a plurality of substrates may be treated in the substrate-treating apparatus at the same time. The substrate-treating apparatus may be classified into positions according to a treating time or a transferring method. When a plurality of holes of the plurality of modules are disposed to have different heights, the substrate-treating apparatus has advantages in a substrate transfer path and a process time. The plurality of movable transfer chambers moves oppositely, and the substrates of different movable transfer chambers are transferred to the other modules whose hole having the same height as the connection holes of the different movable transfer chambers at the same time. The connection means and the movable transfer chamber connected to each other constitute a center path for the substrate holder.

For example, two movable transfer chambers may be disposed to overlap each other in a substrate-treating apparatus and independently move along two tracks. The plurality of modules may be classified into two groups respectively having holes of different heights. Since each movable transfer chamber has a connection hole for the substrate holder, the two movable transfer chambers are connected to two modules through the respective connection means at the same time.

Each movable transfer chamber may have a single connection hole, and the connection means may move up and down. The plurality of holes of the plurality of modules may be disposed to have different heights, and the movable transfer chamber is connected to each of the plurality of modules through the connection means by changing the height of a transfer hole of the transfer module. A substrate may be transferred from the movable transfer chamber to one of the plurality of modules through the connection means without breaking a vacuum. Since a substrate transfer means in the movable transfer chamber is formed to be adjustable along a horizontal direction, the movable transfer chamber is simplified and has an optimized weight.

Each track includes a supporting means and a guide rail supported by the supporting means. The supporting means has a tube shape by a cover and includes a gate supporting the guide rail. In addition, the supporting means crosses the guide rail. The gate has an inner space where particles flow out of the substrate-treating apparatus. The air including the particles flows downward and forms an air curtain. The air curtain is divided by the two movable transfer chambers. A center floor is disposed between the two movable transfer chambers, and has a plurality of through holes. The guide rail is disposed over the center floor and the gate is disposed between the guide rail and the center floor. In addition, the gate is connected to a supporting pipe crossing the center floor. Accordingly, the air of the gate flows into the lower movable transfer chamber through the supporting pipe. The gate may be connected to an air supply source.

The movable transfer chamber is supported by the track through a guide cart. The guide cart may move along the guide rail using a linear driving means, and may include a fixed part and a rolling part. In addition, the guide cart may be disposed over the guide rail with an air layer therebetween using a magnet. As a result, the guide cart moves over the guide rail without contact, and friction generating particles is prevented.

The movable transfer chamber is supported by the guide cart through the supporting console. The supporting console crosses the guide rail and is connected to a sidewall of the movable transfer chamber. In addition, the supporting console linearly leans on the guide cart like a shelf of a semi-trailer. The contact portion of the supporting console and the guide cart may be disposed between two rails of the guide rail. Accordingly, the movable transfer chamber may be swayed with respect to the guide cart along a direction crossing the guide rail for connection to one of the plurality of modules. The movable transfer chamber is approachable to one of the plurality of modules.

The movable transfer chamber according to the present invention has a hexahedral shape for a large-sized substrate. The movable transfer chamber includes a bottom portion, a sidewall portion and a top portion. The bottom and top portions have a bowl shape, and the sidewall portion is disposed between the bottom and top portions. The sidewall portion may be formed of a metallic material having a relatively low weight and high hardness such as titanium (Ti). The bottom portion may be fixed to the sidewall portion, and the top portion may lie on the sidewall portion.

One of the plurality modules may be a transfer module that connects an external substrate supplying unit and the movable transfer chamber. When the movable transfer chamber is connected to the transfer module for transferring a substrate, the movable transfer chamber is evacuated by an external pumping unit connected to the transfer module. Accordingly, an optimum pressure for a process in one of the plurality of modules may be obtained in the movable transfer chamber before the movable transfer chamber is connected to the one of the plurality of modules. Since an additional pumping unit for evacuating the movable transfer chamber is not required, a unit cost is reduced.

The substrate-treating apparatus according to the present invention further includes a vertical substrate transport unit controlling a height of a substrate. One of the plurality of modules (transfer module) has first and second transfer holes opposite to each other, and the vertical substrate transport unit is disposed inside the one module. The vertical substrate transport unit transfers a substrate between the first and second transfer holes. Since valves are connected to the first and second transfer holes, a space between the first and second transfer holes can connect two different pressure conditions. For example, a loading/unloading means under an atmospheric pressure may be connected to the first transfer hole, while the movable transfer chamber under a vacuum may be connected to the second transfer hole. The one module and the movable transfer chamber may be evacuated while the height of the substrate is adjusted. For evacuation, a pumping unit is connected to the one module. While the movable transfer chamber is docked with the one module, the substrate moves up and down and the movable transfer chamber is evacuated through the one module. As a result, the movable transfer chamber is preliminarily evacuated near to a process pressure in the plurality of modules before transferring the substrate. Accordingly, the substrate-treating apparatus has advantages in production time and cost by using the transfer module and the movable transfer chamber.

Figure 1:
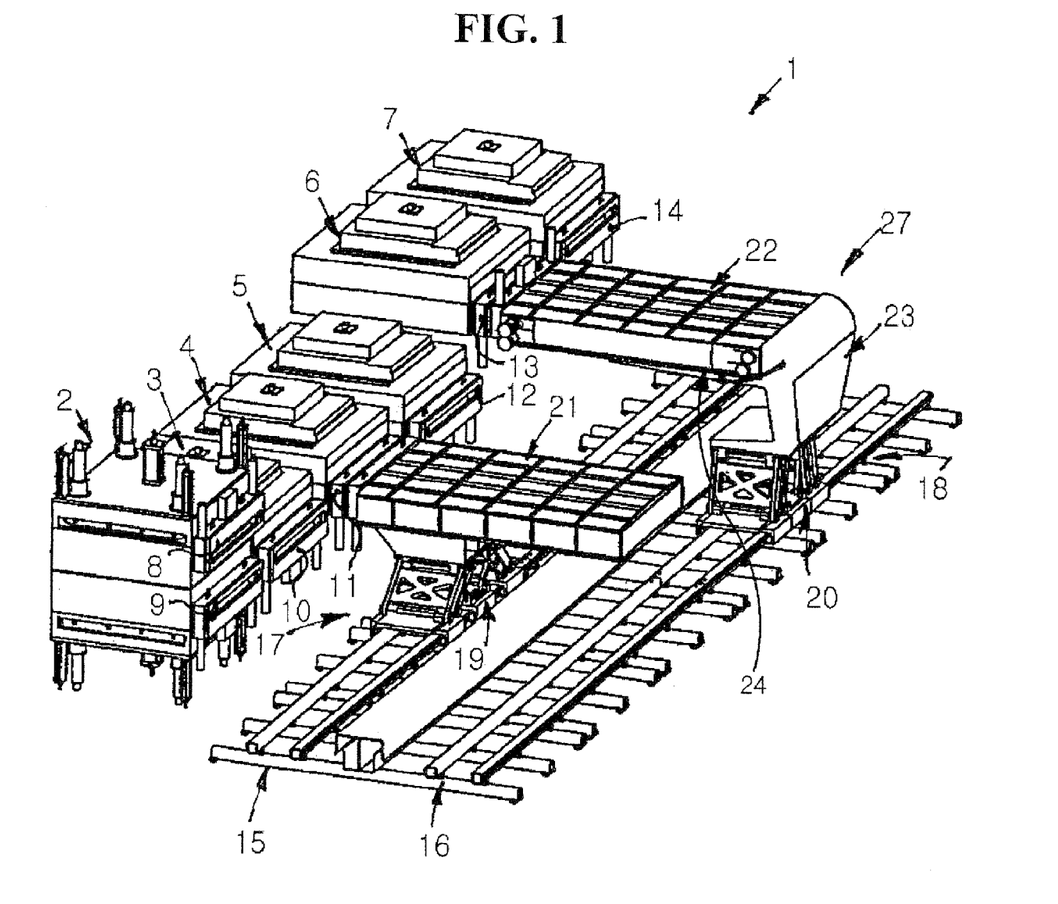
FIG. 1 is a perspective view showing a substrate-treating apparatus according to a first embodiment of the present invention.

FIG. 1 is a perspective view showing a substrate-treating apparatus according to a first embodiment of the present invention.

As shown in FIG. 1, a substrate-treating apparatus 1 includes first to sixth modules 2 to 7 and a transfer unit 27. The first to sixth modules 2 to 7 have first to sixth transfer holes 8 to 14, respectively, on a sidewall facing the transfer unit 27. The first module 2 has the first and second transfer holes 8 and 9. The transfer unit 27 includes first and second tracks 15 and 16. The first and second tracks 15 and 16 parallel to each other are disposed along the first to sixth modules 2 to 7. First and second transport units 17 and 18 are disposed over the first and second tracks 15 and 16, respectively. The first and second transport units 17 and 18 independently move, thereby moving along an opposite direction. As a result, the first and second transport units 17 and 18 may correspond to each of the first to sixth modules 2 to 7 independently. The first and second transport units 17 and 18 include first and second guide slides 19 and 20, respectively. The first and second guide slides 19 and 20 support first and second movable transfer chambers 21 and 22, respectively. The first and second guide slides 19 and 20 may move up and down to adjust height of the first and second movable transfer chambers 21 and 22. The first and second movable transfer chambers 21 and 22 may be connected to each of the first to sixth modules 2 to 7 through the first to seventh transfer holes 8 to 14 to obtain an airtight connection.

For example, the airtight connection between each of the first and second movable transfer chambers 21 and 22 and each of the first to sixth modules 2 to 7 may be obtained by extending a middle portion of each of the first and second movable transfer chambers 21 and 22 like a telescope. The middle portion of each of the first and second movable transfer chambers 21 and 22 may extend along a direction crossing the first and second tracks 15 and 16.

The first and second movable transfer chambers 21 and 22 may have a hexahedral shape corresponding to a size of a substrate. Even though not shown in FIG. 1, the first and second may include a substrate holder having a metal band and a roller. A substrate may be supported and transferred by the substrate holder between each of the first and second movable transfer chambers 21 and 22 and each of the first to sixth modules 2 to 7. The substrate may be disposed on a mass band fitted to the metal band.

A connection means such as a stopping device or a valve that is one portion of packing means is formed at a front portion of each of the first and second movable transfer chambers 21 and 22 facing each of the first to seventh transfer holes 8 to 14. The airtight connection between each of the first and second movable transfer chambers 21 and 22 and each of the first to sixth modules 2 to 7 may be obtained by the connection means while the substrate is transferred. As a result, a pressure condition in each of the first and second movable transfer chambers 21 and 22 is kept for transferring the substrate. The pressure condition in each of the first and second movable transfer chambers 21 and 22 may be obtained when each of the first and second movable transfer chambers 21 and 22 is connected to the first module 2.

The first and second movable transfer chambers 21 and 22 has a volume containing a substrate having of several square meters, thereby having a rectangular hexahedral shape. The first and second movable transfer chambers 21 and 22 cross the first and second tracks 15 and 16. The first movable transfer chamber 21 is supported to the first track 15 adjacent to the first to sixth modules 2 to 7 through the first guide slide 19. In addition, the second movable transfer chamber 22 is supported to the second track 16 farther from the first to sixth modules 2 to 7 through the second guide slide 20. Accordingly, the first movable transfer chamber 21 extend from the first guide slide 19 to the second track 16.

The second movable transfer chamber 22 is connected to the second guide slide 20 through a sub-carrier 23. The sub-carrier 23 includes a supporting plate 24 protruded to each of the first to sixth modules 2 to 7. The second movable transfer chamber 22 is disposed on the supporting plate 24 and extends to the first to sixth modules 2 to 7. The sub-carrier 23 and the guide slide 20 constitutes a U shaped path for the first movable transfer chamber 21. Accordingly, the first and second movable transfer chambers 21 and 22 are independently connected to or separated from the first to sixth modules 2 to 7 regardless of overlapped arrangement of the first and second transport units 17 and 18. Even when heights of the first and second guide slides 19 and 20 are adjustable or heights of the first to seventh transfer holes 8 to 14 in another embodiment, the substrate-treating apparatus may include the sub-carrier 23 constituting a U shaped path.

In addition, a first air circulation space surrounding the first movable transfer chamber 21 may be atmospherically isolated from a second air circulation space surrounding the second movable transfer chamber 22 by the sub-carrier 23.

In this embodiment, the heights of the first and second guide slides 19 and 20 are not adjustable and fixed, and the first and second movable transfer chambers 21 and 22 have fixed heights. For example, the first to seventh transfer holes 8 to 14 may be classified into two groups having different heights, and the first and second movable transfer chambers 21 and 22 may correspond to the two groups of the first to seventh transfer holes 8 to 14, respectively. In addition, the first module 2 may be used as a transfer module and have the first and second transfer holes 8 and 9. The first and second transfer holes 8 and 9 having different heights correspond to the second and first movable transfer chambers 22 and 21, respectively. Further, the first and second transfer holes correspond to two groups of the third to seventh transfer holes 10 to 14, respectively. As a result, the first transfer hole 8 corresponds to the second movable transfer chamber 22, the sixth transfer hole 13 of the fifth module 6 and the seventh transfer hole 14 of the sixth module 7. In addition, the second transfer hole 9 corresponds to the first movable transfer chamber 21, the third transfer hole 10 of the second module 3, the fourth transfer hole 11 of the third module 4 and the fifth transfer hole 12 of the fourth module 5.

The first to sixth modules 2 to 7 may be arranged on the basis of a process time in each module. For example, when the first module 2 is used as a transfer module, the second to sixth modules 3 to 7 may be arranged such that a process time in a first module group including the fifth and sixth modules 6 and 7 is shorter than a process time in a module second group including the second to fourth modules 3 to 5. Accordingly, a total time including the process time and the transfer time for the farther first module group approaches a total time for the second module group. In addition, the heights of transfer holes of the first module group may be different from the heights of transfer holes of the second module group, thereby the first and second movable transfer chambers 21 and 22 corresponding to the second and first module groups, respectively.

The first and second movable transfer chambers 21 and 22 function as a vacuum chamber that transfers a substrate among the first to sixth modules 2 to 7 without breaking a vacuum. In addition, the vacuum of the first and second movable transfer chambers 21 and 22 may be obtained through the first module 2 as a transfer module.

Figure 2:
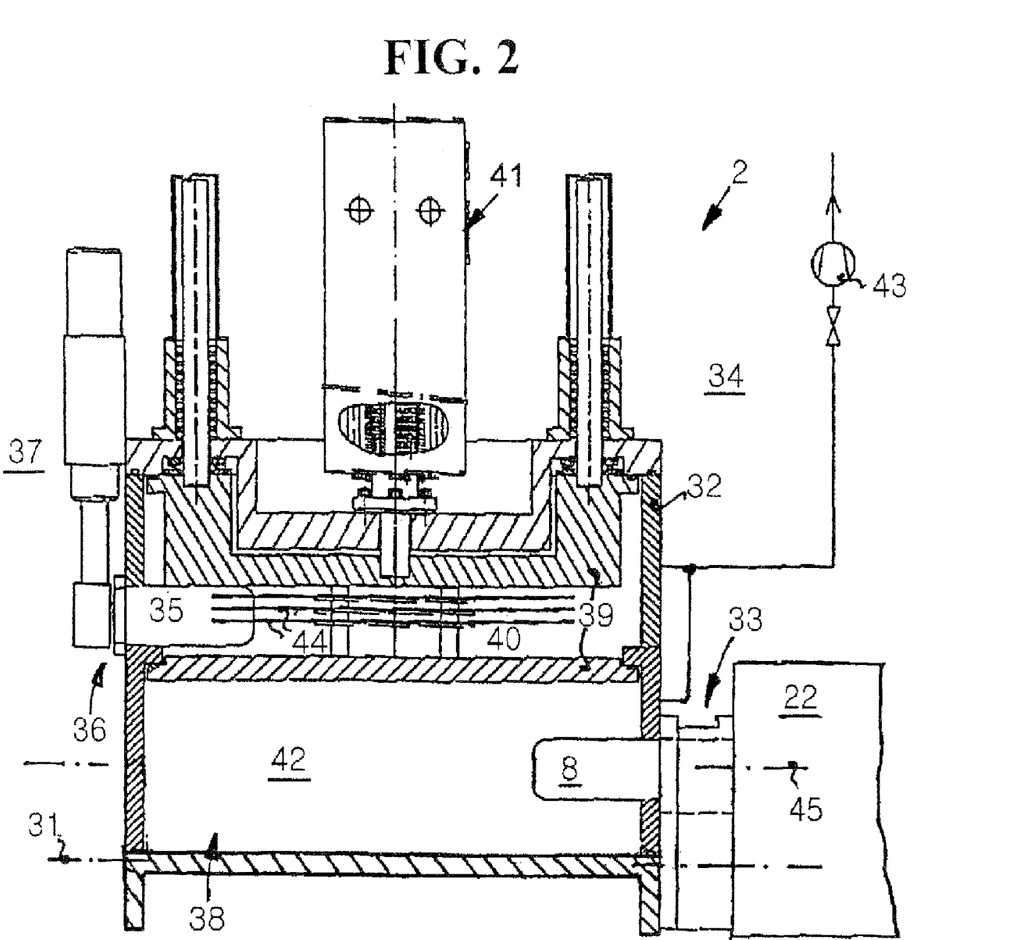
FIG. 2 is a cross-sectional view showing a transfer module for a substrate-treating apparatus according to a second embodiment of the present invention.

FIG. 2 is a cross-sectional view showing a transfer module for a substrate-treating apparatus according to a second embodiment of the present invention.

In FIG. 2, a first module 2 including a main body 32 is used as a transfer module. The main body has a first transfer hole 8 having a height corresponding to a second movable transfer chamber 22 (of FIG. 1). The second transfer chamber 22 (of FIG. 1) is connected to the first module 2 through a first valve 33. The main body 32 includes first and second sidewalls 34 and 37. The first transfer hole 8 is formed in the first sidewall 34, while an eighth transfer hole 35 may be formed in the second sidewall 37. In addition, a second valve 36 is connected to the eighth transfer hole 35. For example, the first transfer hole 8 of the first sidewall 34 may meet a pressure condition of a vacuum and the eighth transfer hole 35 of the second sidewall 37 may meet an atmospheric pressure condition for loading and unloading a substrate. In addition, the outside of the second sidewall 37 may not be a clean room.

The main body 32 defines an inner space 38, and a transport chamber 40 defined by a vertical substrate transport unit 39 is disposed in the inner space 38. The vertical substrate transport unit 39 adjusts a height of the transport chamber 40 using a control means 41. Accordingly, the transport chamber 40 moves up and down in the inner space 38 to correspond to the first and eighth transfer holes 8 and 35.

FIG. 2 shows the transport chamber 40 corresponding to the eighth transfer hole 35 in the second sidewall 37. When the transport chamber 40 corresponds to the eighth hole 35, the inner space 38 may be divided into an interior of the transport chamber 40 and an interior of a control chamber 42 by the vertical substrate transport unit 39. Since the transport chamber 40 and the control chamber 42 are atmospherically separated from each other, the eighth transfer hole 35 corresponding to the transport chamber 40 and the first transfer hole 8 corresponding to the control chamber 42 can be independently used in different pressure conditions.

In addition, the main body 32 is connected to an external pumping unit 43 such as vacuum pump. For example, the transport chamber 40 and the control chamber 42 may be independently connected to the external pumping unit 43. As a result, while the second movable transfer chamber 22 is connected to the first module 2, the second movable transfer chamber 22 may be evacuated through the first valve 33 and the control chamber 42 of the inner space 38 by the external pumping unit 43 to obtain a predetermined pressure condition (vacuum condition). At the same time, the transport chamber 40 having a substrate 44 therein may be adjusted independently of the second movable transfer chamber 22 because the transport chamber 40 is atmospherically separated from the first transfer hole 8.

The inner space 38 is atmospherically combined as the vertical substrate transport unit 39 moves down. As a result, the inner space 38 has a single pressure condition. For the single pressure condition, the transport chamber 40 and the control chamber 42 are evacuated by the pumping unit 43 before the vertical substrate transport unit 39 moves down. Therefore, the inner space 38 between the first and eighth holes 8 and 35 is not divided into atmospherically separated two volumes having different pressure conditions. Instead, the inner space 38 has the single pressure condition by the pumping unit 43. The control chamber 42 may be evacuated before the vertical substrate transport unit 39 moves down or may be evacuated while the vertical substrate transport unit 39 moves down. Accordingly, the second movable transfer chamber 22 has a predetermined pressure condition in a short time period and the substrate-treating apparatus having minimized process time and energy is obtained due to the first module 2.

Even though not shown in FIG. 2, the second transfer hole 9 (of FIG. 1) may be formed in the sidewall under a bottom plate 31 of the first module 2. The second transfer hole 9 (of FIG. 1) may substantially have the same function as the first transfer hole 8.

Figure 3:
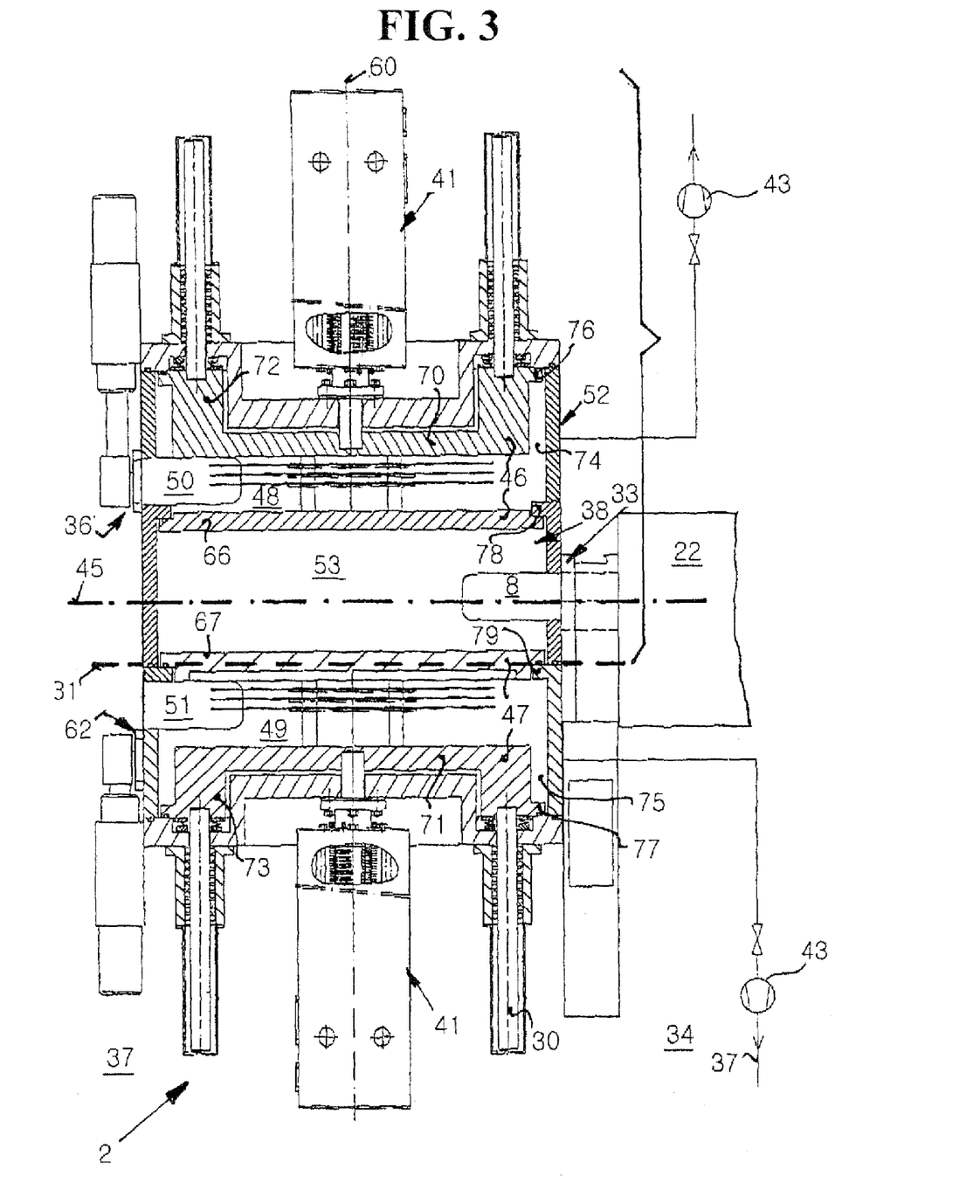
FIG. 3 is a cross-sectional view showing a transfer module of a substrate-treating apparatus according to a third embodiment of the present invention.

FIG. 3 is a cross-sectional view showing a transfer module of a substrate-treating apparatus according to a third embodiment of the present invention.

In FIG. 3, a first module 1 used as a transfer module has a symmetric structure with respect to a central plane 45. The first module 1 includes first and second vertical substrate transport units 46 and 47 in a main body 52. The first and second vertical substrate transport units 46 and 47 may move independently. When the first and second vertical substrate transport units 46 and 47 are separated from each other, an inner space 38 defined by the main body 52 may be divided into a first transport chamber 48, a second transport chamber 49 and a control chamber 53 between the first and second transport chambers 48 and 49. A first transfer hole 8 is formed in a first sidewall 34, while eighth and ninth transfer holes 50 and 51 are formed in a second sidewall 37. For example, the first transfer hole 8 of the first sidewall 34 may meet a pressure condition of a vacuum, and the eighth and ninth transfer holes 50 and 51 of the second sidewall 37 may meet an atmospheric pressure condition for loading and unloading a substrate. The control chamber 53 corresponds to the first transfer hole 8, and the first and second transport chambers 48 and 49 correspond to the eighth and ninth transfer holes 50 and 51, respectively.

A second movable transfer chamber 22 connected to the first transfer hole 8 may be evacuated through the inner space 38 of the first module 2. The first and second transport chambers 48 and 49 are connected to respective external pumping units 43. The control chamber 53 may be atmospherically connected to one of the first and second transport chambers 48 and 49 by moving the first and second vertical substrate transport units 46 and 47. Accordingly, the second movable transfer chamber 22 may have a predetermined pressure condition through the first transfer hole 8.

The first module 2 of FIG. 3 has advantages especially when it is hard to form two transfer holes in the first sidewall 34 due to a structural limitation. In addition, a substrate-treating apparatus may include two transfer modules according to the third embodiment for the purpose of increasing transfer speed of a substrate. For example, two transfer modules may be arranged at both sides of the tracks 15 and 16 (of FIG. 1).

As referring again to FIG. 3, eighth and ninth transfer holes 50 and 51 are formed in a second sidewall 37 of the main body 52. As a result, the first and second transport units 46 and 47 correspond to the first transfer hole 8 in common. In addition, the first transport unit 46 moves between the first and eighth transfer hole 8 and 50, and the second transport unit 47 moves between the first and ninth transfer hole 8 and 51. Accordingly, the first module 2 has a simplified symmetrical structure with respect to the central plane 45.

When the first and second transport chambers 48 and 49 correspond to the eighth and ninth transfer holes 50 and 51, respectively, a control chamber 53 is defined by a space between the first and second transport chambers 48 and 49. Each of the first and second transport chambers 48 and 49 is selectively connected to one of the first, eighth and ninth transfer holes 8, 50 and 51 by the first and second vertical substrate transport units 46 and 47. The transfer module for the substrate-treating apparatus of FIG. 3 has advantages specifically in a case such that a transfer time of a substrate to the first and second transport chambers 48 and 49 through the eight and ninth transfer holes 50 and 51 is longer than a transfer time of a substrate between the second movable transfer chamber 22 and one of the first and second transport chambers 48 and 49. With the first transfer hole 8 closed by the first valve 33, the control chamber 53 may be evacuated to reach a predetermined pressure condition while the first and second transport chambers 48 and 49 move by the first and second transport units 46 and 47. In addition, after the second movable transfer chamber 22 is connected to the main body 52, the first transfer 8 becomes open and the second movable transfer chamber 22 is evacuated through the control chamber 53.

Since each of the first to sixth modules 2 to 7 (of FIG. 1) is atmospherically connected to and isolated from one of the first and second movable transfer chambers 21 and 22 by the first valve 33, the substrate-treating apparatus requires a corresponding volume for transferring a substrate. Accordingly, a substrate transfer path atmospherically isolated from exterior is obtained between one of the first and second movable transfer chambers 21 and 22 and one of the first to sixth modules 2 to 7 (of FIG. 1). In addition, the substrate transfer path may have a direction crossing the first and second tracks 15 and 16 (of FIG. 1) without moving the first and second movable transfer chambers 21 and 22 greatly.

Figure 4:
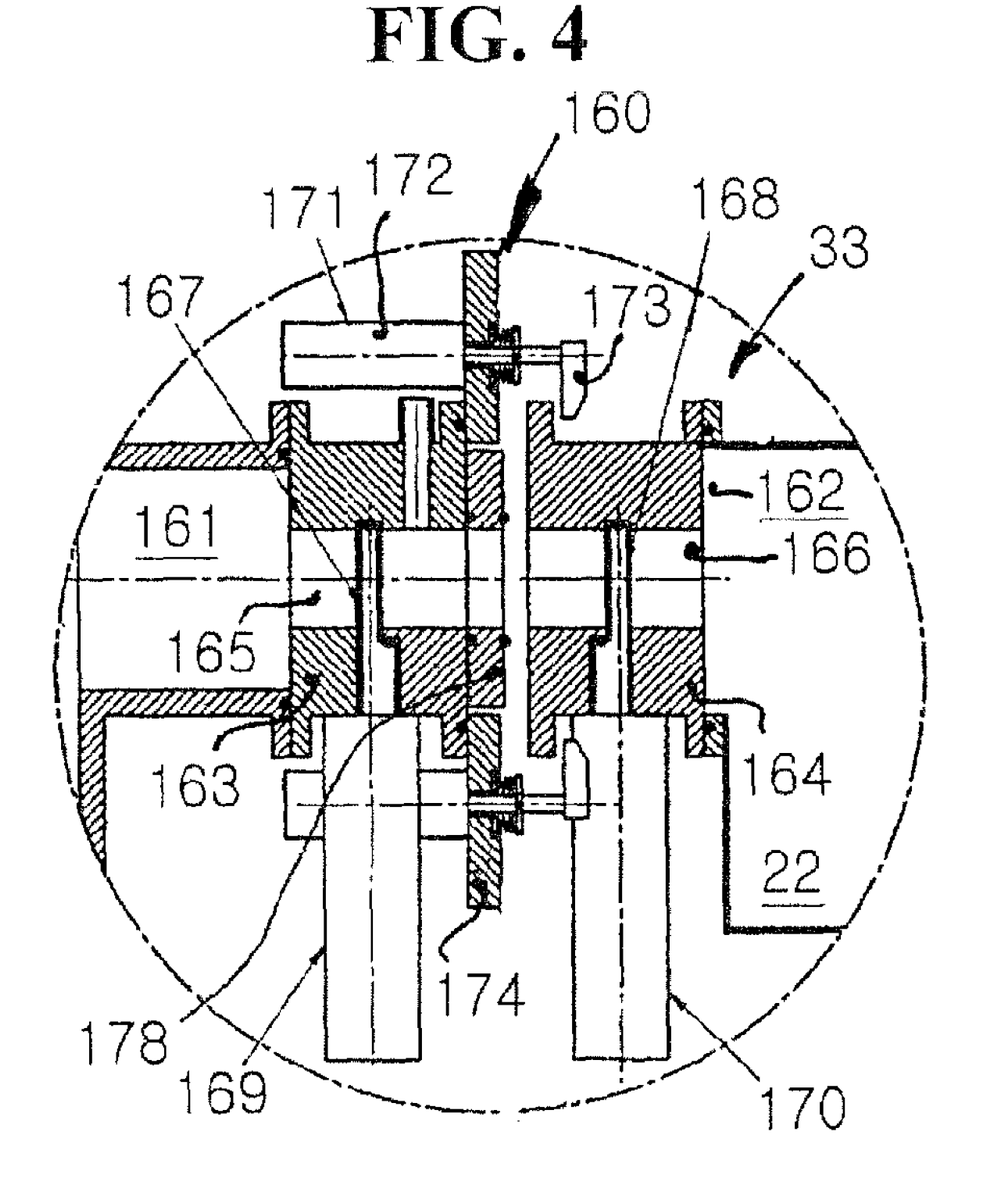
FIG. 4 is a cross-sectional view showing a close state of a module and a movable transfer chamber for a substrate-treating apparatus according to a fourth embodiment of the present invention.
Figure 5:
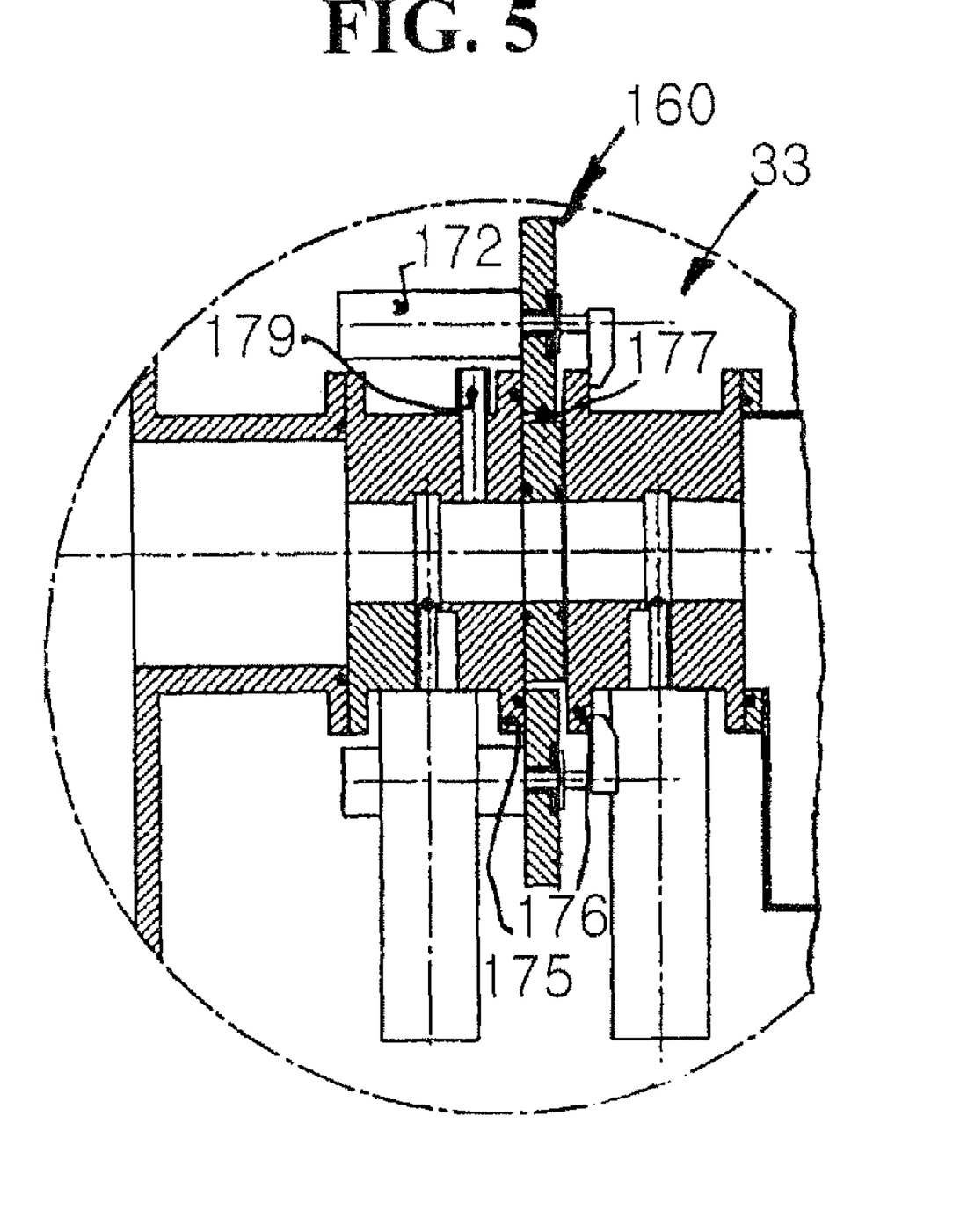
FIG. 5 is a cross-sectional view showing an open state of a module and a movable transfer chamber for a substrate-treating apparatus according to a fourth embodiment of the present invention.

FIGS. 4 and 5 are cross-sectional views showing a close state and an open state, respectively, of a module and a movable transfer chamber for a substrate-treating apparatus according to a fourth embodiment of the present invention.

In FIGS. 4 and 5, a module and a movable transfer chamber are connected to each other through a connection means such as a valve 33 including a fixing means 160. One of first and second movable transfer chambers 21 and 22 (of FIG. 1), which is referred to as a movable transfer chamber for illustration regarding FIGS. 4 and 5, is fixed to or is released from one of first to sixth modules 2 to 7 (of FIG. 1), which is referred to as a module for illustration in FIGS. 4 and 5, using the fixing means 160. For the purpose of connection and separation, the movable transfer chambers may slightly move along a direction crossing first and second tracks 15 and 16 (of FIG. 1), while the module may have a fixed disposition. Accordingly, the first and second tracks 15 and 16 (of FIG. 1) may support the movable transfer chamber and the position of the movable transfer chamber may be slightly changed due to elasticity. As a result, the movable transfer chamber may be pulled and fixed to the module by the fixing means 160. After the fixing means 160 releases the movable transfer chamber, the movable transfer chamber may go back to an original position due to the elasticity. For the purpose of connection and separation, the module may be spaced apart from the movable transfer chamber by a relatively small distance. For example, the relatively small distance may be less than about 1 cm.

A first frame 163 is formed in a transfer hole 161 of the module, and a second frame 164 is formed in an open portion of the movable transfer chamber on the basis of a cross-sectional size of the transfer hole, a switching of the transfer hole and the fixing means 160 of the valve 33. The first and second frames 163 and 164 include first and second through holes 165 and 166, respectively, corresponding to a size of a substrate. In addition, first and second blocking means 167 and 168 having a plate shape are disposed in the first and second through holes 165 and 166, respectively. The first and second blocking means 167 and 168 may switch the first and second through holes 165 and 166, respectively, by moving along a direction crossing the first and second through holes 165 and 166. Heights of the first and second blocking means 167 and 168 may be changed by a linear adjustment unit such as a control cylinder 169 and 170. Since the first and second blocking means 167 and 168 completely block the first and second through holes 165 and 166, respectively, the module and the movable transfer chamber are completely isolated from each other at a blocking position.

The fixing means 160 on each of the first to sixth modules 2 to 7 (of FIG. 1) may be fixed to the first frame 163. The fixing means 160 may include a cylinder 172 and a rod 171. The cylinder on the first frame 163 extends or contracts the rod 171, and the rod 171 includes a head 173. The head 173 corresponds to a protrusion of the second frame 164 fixed to the movable transfer chamber. The cylinder 172 of the fixing means 160 may be fixed to a supporting fringe 174 surrounding the first through hole 165, and the supporting fringe 174 may be disposed between the first and second frames 163 and 164. The first and second frames 163 and 164 may further include first and second trusses 175 and 176, respectively. The first truss 175 may be used for fixing the supporting fringe 174 and the second truss 176 may be used as the protrusion for the head 173.

The supporting fringe 174 may have an opening 177 larger than the first through hole 165, and a sealing disc 178 having substantially the same size of the first through hole 165 may be disposed in the opening 177. Since the sealing disc 178 may have a greater thickness than the supporting fringe 174, the first and second frames 163 and 164 may not contact each other directly but be connected to each other through the sealing disc 178 when the module and the movable transfer chamber are connected to each other. Accordingly, the module and the movable transfer chamber are supported by each other and atmospherically isolated from exterior. In addition, the module and the movable transfer chamber are connected to each other with a simplified structure due to the valve 33 and the sealing disc 178.

To reduce a weight of the first and second frames 163 and 164 regardless of their sizes, a plurality of rods 171 may be disposed around the boundary of the first frame 163 and spaced apart from each other. Since the supporting fringe 174 where the plurality of rods 171 are fixed and the sealing disc 178 are supported by the first frame 163 of the module, the weight of the second frame 164 is reduced in the above structure.

An additional exhaust 179 may be connected to one of the first and second through holes 165 and 166 between the first and second blocking means 167 and 168. The first and second through holes 165 and 166 may be evacuated by an external pumping unit through the additional exhaust 179.

Figure 6:
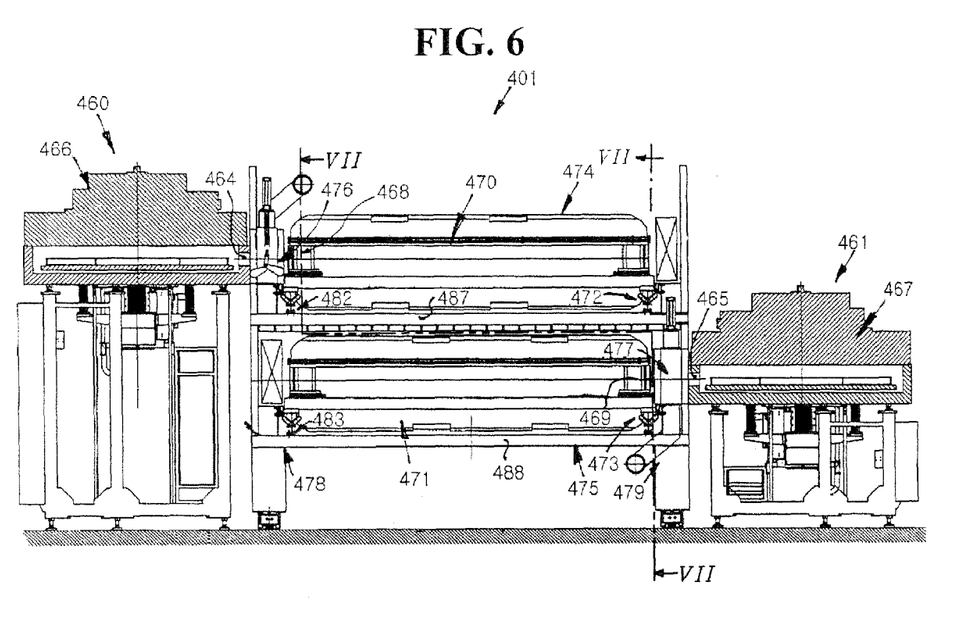
FIG. 6 is a cross-sectional view showing a substrate-treating apparatus according to a fifth embodiment of the present invention.

FIG. 6 is a cross-sectional view showing a substrate-treating apparatus according to a fifth embodiment of the present invention. Further, FIG. 7 is a cross-sectional view taken along a line "VII-VII" of FIG. 6, and FIG. 8 is a magnified view of a portion "VIII" of FIG. 7.

Figure 7:
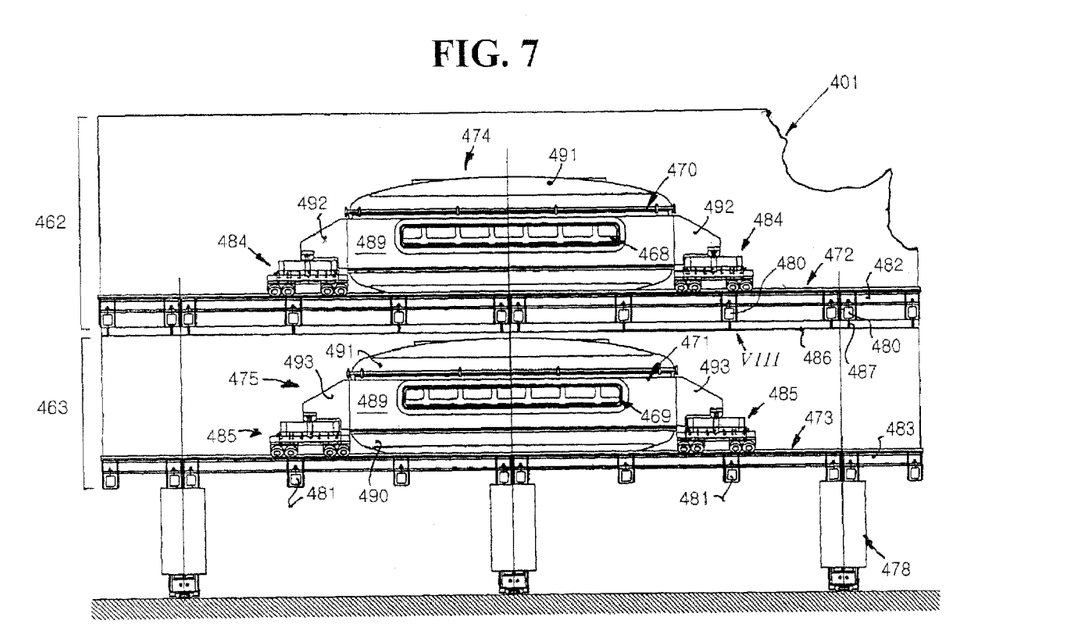
FIG. 7 is a cross-sectional view taken along a line "VII-VII" of FIG. 6.
Figure 8:
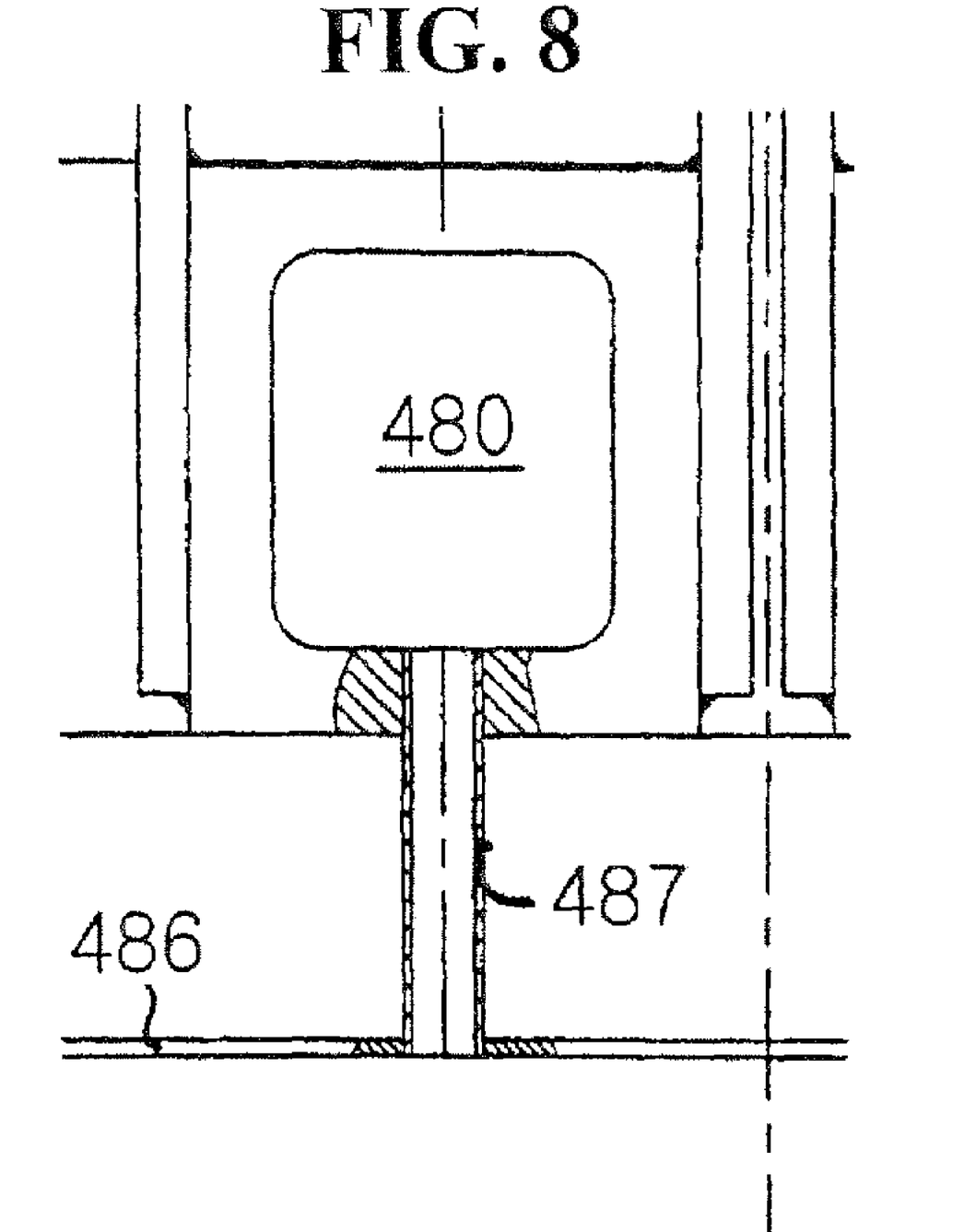
FIG. 8 is a magnified view of a portion "VIII" of FIG. 7.

As shown in FIGS. 6 to 8, a substrate-treating apparatus 401 includes a first transfer unit 462, a second transfer unit 463, a first module unit 460 and a second module unit 461. The first and second transfer units 462 and 463 overlap each other in a plane view and are disposed between the first and second module units 460 and 461 facing each other. The first transfer unit 462 includes a first movable transfer chamber 470, a first transport unit 474 and a first track 472, and the second transfer unit 463 includes a second movable transfer chamber 471, a second transport unit 475 and a second track 473. In addition, the first and second module units 460 and 461 include first and second modules 466 and 467, respectively. The first and second movable transfer chambers 470 and 471 include first and second open portions 468 and 469, respectively. Further, the first and second modules 466 and 467 include first and second transfer holes 464 and 465, respectively. The first and second open portions 468 and 469 are formed on opposite sidewalls of the first and second movable transfer chambers 470 and 471 to correspond to the first and second transfer holes 464 and 465, respectively. Moreover, the first and second movable transfer chambers 470 and 471 are supported by the first and second tracks 472 and 473, respectively.

Even though the first second movable transfer chambers 470 and 471 are disposed over the first and second tracks 472 and 473, respectively, in this embodiment, first and second movable transfer chambers are disposed under first and second tracks, respectively, with hung in another embodiment. In addition, a first movable transfer chamber is disposed over a first track and a second movable transfer chamber is disposed under a second track with hung in another embodiment.

Even though not shown in FIGS. 6 to 8, each of the first and second module units 460 and 461 may include a plurality of modules arranged along the first and second tracks 472 and 473. Each module of the first module unit 460 may have a transfer hole having substantially the same height as the first transfer hole 464 and the first open portion 468. Similarly, each module of the second module unit 461 may have a transfer hole having substantially the same height as the second transfer hole 465 and the second open portion 469. Accordingly, the first movable transfer chamber 470 moves along the first track 472 and transfers a substrate to the corresponding module of the first module unit 460, and the second movable transfer chamber 471 moves along the second track 473 and transfers a substrate to the corresponding module of the second module unit 461. For these transfer operations, the first and second movable transfer chambers 470 and 471 include the first and second open portions 468 and 469 on the opposite sidewalls, respectively. As a result, the substrate transfer operations of the first and second movable transfer chambers 470 and 471 are simplified and the transfer time is reduced.

As shown in FIGS. 6 and 7, a first connection means 476 is disposed between the first movable transfer chamber 470 and the first module 466, and a second connection means 477 is disposed between the second movable transfer chamber 471 and the second module 467. Accordingly, the first transfer hole 464 is connected to the first open portion 468 through the first connection means 476 with atmospherically isolated from exterior, and the second transfer hole 465 is connected to the second open portion 469 through the second connection means 477 with atmospherically isolated from exterior. Therefore, airtight connections between the first movable transfer chamber 470 and the first module 466 and between the second movable transfer chamber 471 and the second module 467 are obtained, and a predetermined pressure and cleanity condition are kept for transferring a substrate. For example, a valve of FIGS. 4 and 5 may be used as a connection means.

The first and second transfer units 462 and 463 are supported by first and second supporting pillars 478 and 479. The first supporting pillar 478 is disposed between the first module unit 460 and the first transport unit 474, and the second supporting pillar 479 is disposed between the second module unit 461 and the second transport unit 475. The first and second pillars 478 and 479 may have a pipe shape having a cap considering the first connection means 478, the second connection means 477 and the other parts of the substrate-treating apparatus 401.

The first track 472 is supported by the first supporting pillar 478 through a first gate 480, and the second track 473 is supported by the second supporting pillar 479 through a second gate 481. The first and second tracks 472 and 473 include first and second guide rails 482 and 483, respectively, and first and second guide carts 484 and 485 move along the first and second tracks 472 and 473, respectively, by a linear driving means. Accordingly, the first movable transfer chamber 470 moves along the first guide rail 482 using the first guide cart 484, and the second movable transfer chamber 471 moves along the second guide rail 483 using the second guide cart 485.

A first air circulation space for movement of the first movable transfer chamber 470 is atmospherically isolated from a second air circulation space for movement of the second movable transfer chamber 471. Air flows from a top portion to a bottom portion to eliminate contamination materials such as gas and particle, and is exhausted from the air circulation space. For example, the air may be exhausted side portions of the first and second supporting pillars 478 and 479 at ends of the tracks. A center floor 486 is used for dividing the first and second spaces. The center plate 486 is disposed under and spaced apart from the first gate 480 of the first track 472. Even though not shown in FIGS. 6 to 8, a metal floor having plurality of holes may be further disposed over the center floor 489 with a predetermined gap. Accordingly, a ventilation path of the air stream is obtained between the metal floor and the center floor 489.

As shown in FIG. 8, the center floor 486 is connected to the first gate 480 having a cavity through a supporting pipe. Since the first gate 480 is connected to an external air supply source, the first gate 480 may be used as an air supply tube where an air is supplied. Accordingly, the air may flow through the first gate 480 having the cavity therein and the supporting pipe 487 having an air path therein to the second air circulation space having the second transport unit 475. Since the supporting pipe 487 is formed to cross the center floor 486, the air may flow in the second air circulation space when the air is injected through the metal floor and the center floor 486. In addition, the second air circulation space may include a bottom floor. For example, the bottom floor may be a metal plate having a plurality of holes similar to the metal floor over the center floor 486.

The first and second movable transfer chambers 470 and 471 may have substantially the same shape as each other in this embodiment. In another embodiment, however, the first and second movable transfer chambers 470 and 471 may have different shapes only if the first and second open portions 468 and 469 are formed at opposite sidewalls. Each of the first and second movable transfer chambers 470 and 471 may include a sidewall 489, a bottom 490 and a cover 491. In addition, each of the first and second movable transfer chambers 470 and 471 may have a flat arch shape. The bottom 490 and the cover 491 may include a relatively light and hard fiber material, and the sidewall 489 may include a relatively light and hard metallic material such as titanium (Ti). Furthermore, the bottom 490 may be attached to the sidewall 489, while the cover 491 may be detachably fixed to the sidewall 489.

First and second supporting consoles 492 and 493 are connected to the sidewall 489. The first and second supporting consoles 492 and 493 are disposed at opposite portions of the sidewall 489 and along each of the first and second tracks 472 and 473. Each of the first and second movable transfer chambers 470 and 471 is supported to one of the first and second guide carts 484 and 485 through the first and second supporting consoles 492 and 493. The first and second supporting consoles 492 and 493 lean on the first and second guide carts 484 and 485, respectively, like a shelf of a semi-trailer. Accordingly, each of the first and second movable transfer chambers 470 and 471 may be swayed with respect to one of the first and second guide carts 484 and 485 along a direction crossing the first and second guide rails 482 and 483 for connection to one of a plurality of modules due to elasticity. In other words, each of the first and second movable transfer chambers 470 and 471 is approachable to one of a plurality of modules so that the open portion of the movable transfer hole can contact the transfer hole of the module.

Consequently, the substrate-treating apparatus according to the present invention treats a large-sized substrate under a high vacuum condition with a minimized energy using a movable transfer chamber. In addition, a process time and a process space are effectively used due to the minimization of transfer time and a structural simplification of the movable transfer chamber. Moreover, the substrate is transferred under a high vacuum condition without a case wrapping the whole apparatus or a clean room surrounding the apparatus by using the movable transfer chamber surrounding the substrate.

It will be apparent to those skilled in the art that various modifications and variations can be made in a substrate-treating apparatus including a movable transfer chamber without departing from the spirit or scope of the invention. Thus, it is intended that the present invention covers the modifications and variations of this invention provided they come within the scope of the appended claims and their equivalents.

What is claimed is:

1. A substrate-treating apparatus, comprising:
   a plurality of modules disposed along a first direction, each of the plurality of modules having an inner space for containing a substrate; and
   a transfer unit for transferring the substrate among the plurality of modules, the transfer unit including first and second tracks disposed along the first direction on a horizontal plane and first and second movable transfer chambers for moving along the first and second tracks, respectively,
   wherein the first and second movable transfer chambers are atmospherically isolated from an exterior while moving,
   wherein the first movable transfer chamber is arranged and structured to move under the second movable transfer chamber,
   wherein the first and second movable transfer chambers overlap with each other in plan view, wherein the first and second movable transfer chambers are adapted to move parallel with the horizontal plane along the first and second tracks, respectively, such that the first and second movable transfer chambers are connected to the plurality of modules without breaking a pressure condition.

2. The apparatus according to claim 1, wherein each of the plurality of modules includes a transfer hole, and each of the first and second movable transfer chambers includes an open portion corresponding to the transfer hole.

3. The apparatus according to claim 2, wherein each of the first and second movable transfer chambers is approachable to one of the plurality of modules so that the open portion contacts the transfer hole.

4. The apparatus according to claim 2, wherein each of the open portion and the transfer hole has a size such that the substrate passes through.

5. The apparatus according to claim 1, wherein the first and second movable transfer chambers independently move along the first and second tracks, respectively.

6. The apparatus according to claim 1, wherein the first and second movable transfer chambers are disposed to have different heights.

7. The apparatus according to claim 6, wherein the first and second tracks are spaced apart from each other along a second direction crossing the first direction.

8. The apparatus according to claim 7, wherein the second direction is a horizontal direction, and the first and second tracks are parallel to each other.

9. The apparatus according to claim 8, wherein a central portion of the first movable transfer chamber is supported by the first track, and an edge portion of the second movable transfer chamber is supported by the second track.

10. The apparatus according to claim 9, wherein the first movable transfer chamber is supported by and moves along the first track through a first guide slide, and the second movable transfer chamber is supported by and moves along the second track through a second guide slide.

11. The apparatus according to claim 10, wherein the edge portion of the second movable transfer chamber is connected to the second guide slide through a sub-carrier such that the second movable transfer chamber is protruded from the second guide slide to the plurality of modules.

12. The apparatus according to claim 11, wherein the sub-carrier has a U shape such that an opening of the U shape faces the plurality of modules.

13. The apparatus according to claim 12, wherein the sub-carrier provides a path for moving the first movable transfer chamber.

14. The apparatus according to claim 10, wherein heights of the first and second movable transfer chambers with respect to the first and second tracks are adjustable by the first and second guide slides, respectively.

15. The apparatus according to claim 1, wherein the plurality of modules include a plurality of transfer holes, and at least two transfer holes have different heights.

16. The apparatus according to claim 15, wherein at least two modules having at least two transfer holes of the same heights are arranged adjacently.

17. The apparatus according to claim 15, wherein the plurality of modules are arranged according to a process time in each of the plurality of modules.

18. The apparatus according to claim 15, wherein the plurality of modules includes a transfer module for transferring and distributing the substrate and a process module for treating the substrate, wherein the transfer module includes first and second transfer holes having different heights.

19. The apparatus according to claim 18, wherein a distance between the transfer module and the process module is determined according to a process time in the process module.

20. The apparatus according to claim 19, wherein the first and second transfer chambers are arranged at an exterior position of the plurality of modules.

* * * * *